United States Patent [19]

Havens et al.

[11] Patent Number: 5,780,834
[45] Date of Patent: Jul. 14, 1998

[54] IMAGING AND ILLUMINATION OPTICS ASSEMBLY

[75] Inventors: William H. Havens; Charles M. Hammond, Jr., both of Skaneateles; Robert J. Hennick, Auburn; Robert C. Hinkley, Skaneateles; Robert J. Wood, Sr., Syracuse; Tanya A. Onori, Auburn; Thomas W. Karpen, Skaneateles, all of N.Y.

[73] Assignee: Welch Allyn, Inc., Skaneateles Falls, N.Y.

[21] Appl. No.: 649,126

[22] Filed: May 14, 1996

Related U.S. Application Data

[63] Continuation-in-part of Ser. No. 805,739, Feb. 25, 1997, which is a continuation of Ser. No. 441,037, May 15, 1995, abandoned.

[51] Int. Cl.[6] .................................................. G06K 7/10
[52] U.S. Cl. ........................................ 235/472; 235/455
[58] Field of Search .................................. 235/454, 472, 235/455

[56] References Cited

U.S. PATENT DOCUMENTS

| 4,488,679 | 12/1984 | Bockholt | 235/469 |
|---|---|---|---|
| 4,570,057 | 2/1986 | Chadima, Jr. | 235/472 |
| 5,331,176 | 7/1994 | Sant' Anselmo | 250/566 |
| 5,378,883 | 1/1995 | Batterman | 235/472 |
| 5,521,366 | 5/1996 | Wang | 235/454 |
| 5,600,116 | 2/1997 | Seo et al. | 235/454 |

FOREIGN PATENT DOCUMENTS

WO 9215036  9/1992  WIPO.

*Primary Examiner*—Harold Pitts
*Attorney, Agent, or Firm*—Wall Marjama & Billinski

[57] ABSTRACT

A low profile optical unit for use in a 2D bar code reader. A vertically disposed light redirecting panel having contoured reflective openings therein is mounted in the front of the unit and an LED behind the panel. Light emitting diodes for illuminating a target are mounted on the LED board behind the contour openings whereby direct light and reflected light illuminates a target. An imager housing is mounted on the back of the LED board and contains a recess that passes through the back of the housing and a lens barrel that extends forward through holes provided in the LED board and the light redirecting panel. An imager board is secured to the back of the housing which holds a 2D imager that is contained within the housing recess. Circuitry for generating image data signals is mounted on the back of the imager board. A lens holder is threadably mounted in the lens barrel which contains a lens system having a short back focal length for focusing a target image on the imager.

17 Claims, 6 Drawing Sheets

IMAGING AND ILLUMINATION OPTICS ASSEMBLY

CROSS-REFERENCES TO RELATED APPLICATIONS

This application is a continuation-in-part of prior U.S. patent application Ser. No. 08/441,037, filed May 15, 1995, now abandoned.

BACKGROUND OF THE INVENTION

This invention relates to a low profile optical unit suitable for use in a small or miniature bar code reader, such as a hand-held bar code reader that is equipped with a two dimensional (2D) image sensor.

Bar code readers have, until recently, been designed to scan linearly in one dimension only. As disclosed in U.S. Pat. Nos. 5,378,883 to Batterman and 5,331,786 to Sant Anselmo et al. "omnidirectional" readers have been developed that utilize solid state imagers that are able to scan rapidly in two dimensions. The 2D readers also have the ability of reading multiple targets during the course of one scanning pass to acquire additional data in a very short period of time.

Although the recently developed 2D readers have many advantages over their one dimensional counterparts, they require additional electrical and lighting components, and thus occupy more space. Space in a hand-held reader is rather limited and any reduction in the size and weight of the optical unit adds greatly to the ease of operation of the reader and a corresponding reduction in operator fatigue. In addition, a small, light weight reader can be more easily and accurately placed upon a target thereby minimizing the amount of time the reader must be on, which is an important consideration with regard to battery operated units.

The 2D readers are usually equipped with light emitting diodes (LED) for illuminating a target. The LEDs are arranged upon a board about the lens system which focuses an image of the illuminated target upon the 2D imager. The distal ends of the LEDs, however, extend some distance beyond the front lens of the lens system. In addition, these readers are equipped with light polarizing filters which are mounted in front of the LED. As a consequence, a good deal of space forward of the lens system is required to accommodate the LEDs and polarizing filters. Placing the LEDs forward of the lens system can also have an adverse effect on image quality, particularly when the target is mounted upon a highly reflective surface. Direct light from the LEDs can, under certain conditions, combine with the light coming back to the imager from the highly reflective surface to over-expose the imager.

SUMMARY OF THE INVENTION

It is an object of the present invention to improve hand-held bar code readers having a two-dimensional scanning capability.

It is a further object of the present invention to reduce the size of the optical unit of hand-held bar code readers.

It is a still further object of the present invention to provide a low profile optical unit having a two dimensional reading capability that is easily mountable in the head of a hand-held bar code reader.

Another object of the present invention is to provide a low profile and compact optical unit for use in a bar code reader that effectively illuminates and reads a bar code target at extended ranges.

Still another object of the present invention is to compact the optical unit of a 2D bar code reader while at the same time enhancing its ability to illuminate and read a bar code target that is some distance from the 2D imager.

These and other objects of the present invention are attained by using a low profile optical unit in a bar code reader which, in one embodiment, includes a light redirecting panel having a series of contoured openings passing therethrough. An LED board is mounted immediately behind the panel and contains a plurality of flat topped light emitting diodes (LEDs) that are positioned behind the contoured openings in the panel. The surfaces of the opening are reflective and are arranged to redirect the illumination from the LEDs into the target region. An imager housing is secured to the back of the LED board and has a recessed chamber that opens to the back of the housing. An integral hollow lens barrel extends forward of the chamber and passes through holes provided in the LED board and the light redirecting panel. An imager board is secured to the back of the housing and has a solid state 2D imager mounted on its front face that is contained within the recessed chamber of the housing. A lens holder is adjustably mounted within the lens barrel which focusses a target image upon the imager. The back focal length of the lens system is minimized along with the spacing between the light redirecting panel and the LED board to minimize the amount of space required by the unit. An aiming or spotting light is mounted over the lens barrel in a recessed seat formed in the light redirecting panel and the LED board to further minimize the amount of space consumed by the unit.

BRIEF DESCRIPTION OF THE DRAWINGS

For a better understanding of these and other objects of the present invention reference will be made to the following detailed description of the invention which is to be read in conjunction with the associated drawings, wherein.

DESCRIPTION OF THE INVENTION

Figure 1:
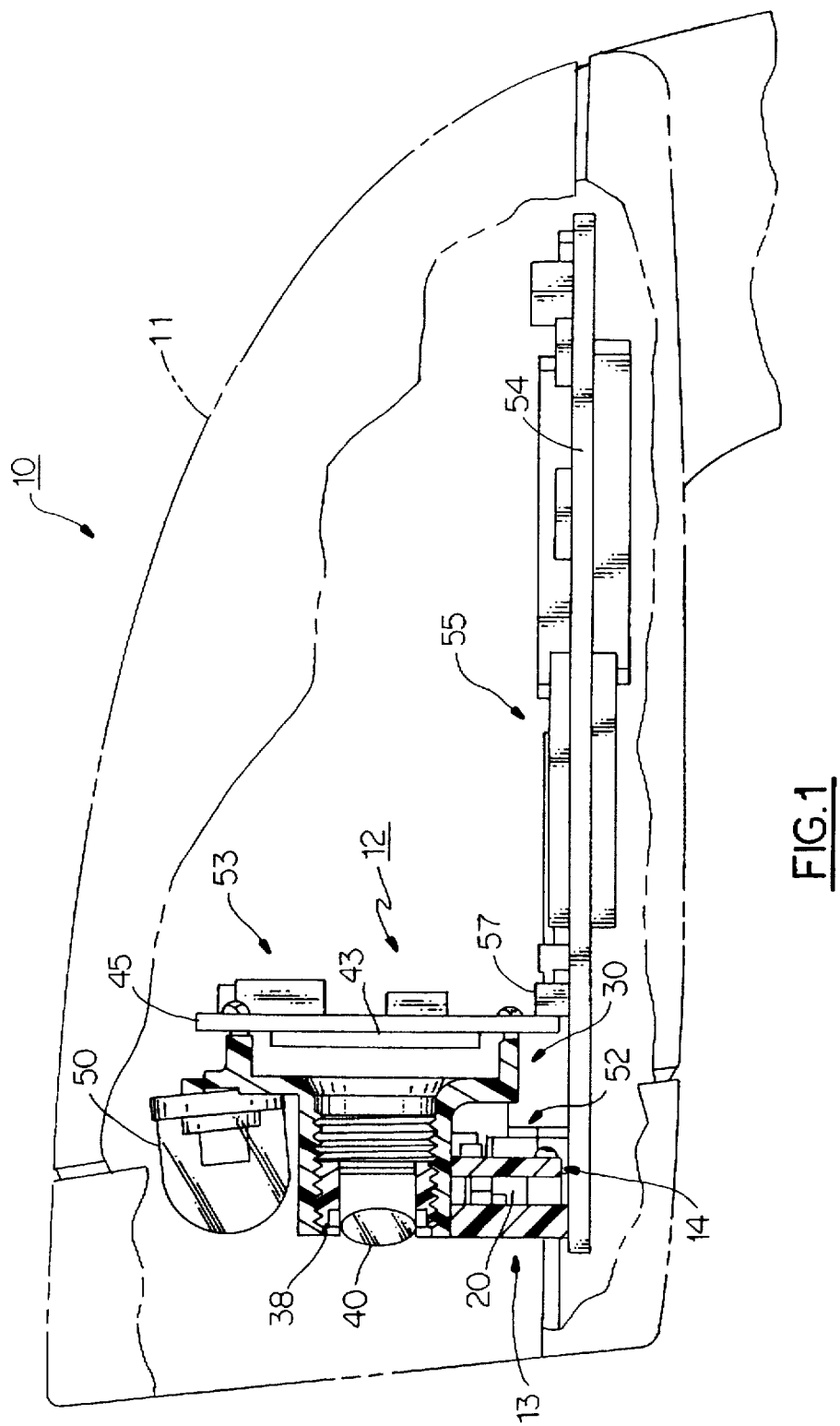
FIG. 1 is a side elevation of a hand-held bar code reader containing a low profile optical unit embodying the teachings of the present invention.
Figure 2:
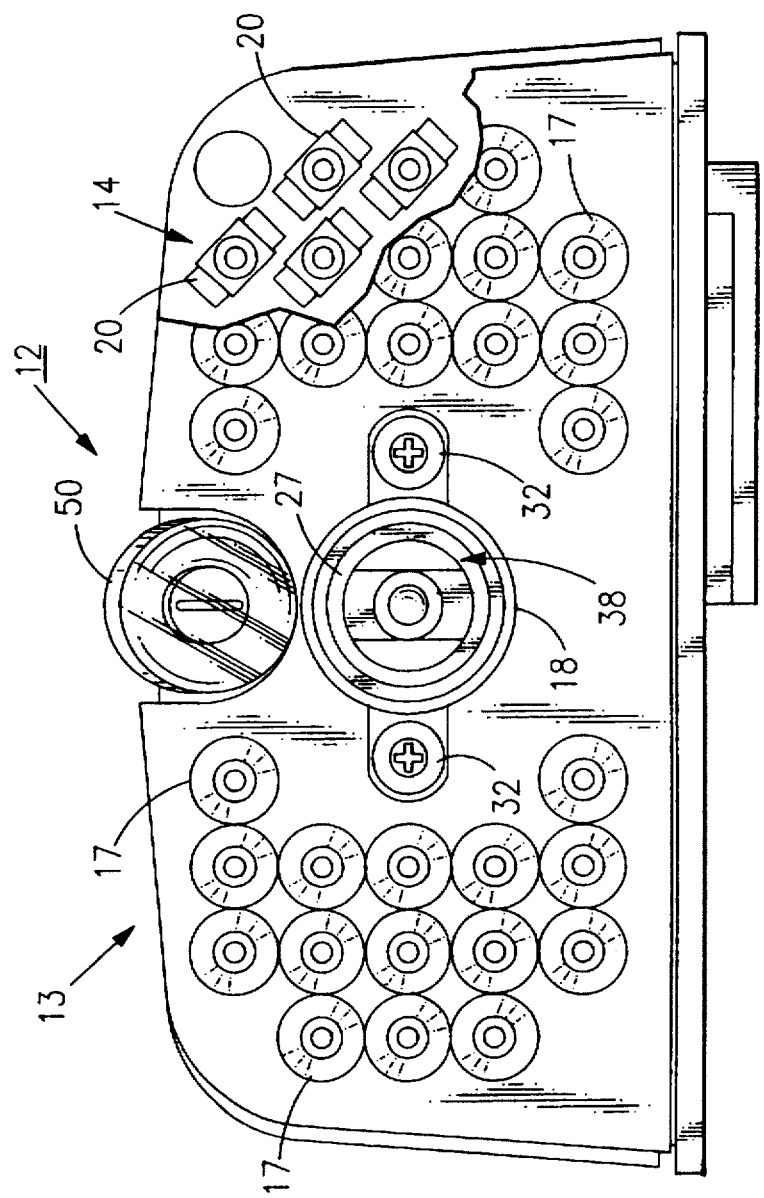
FIG. 2 is an enlarged front view of the optical unit illustrated in FIG. 1 further showing the light redirecting panel and the light emitting diode arrangement utilized in the unit.
Figure 3:
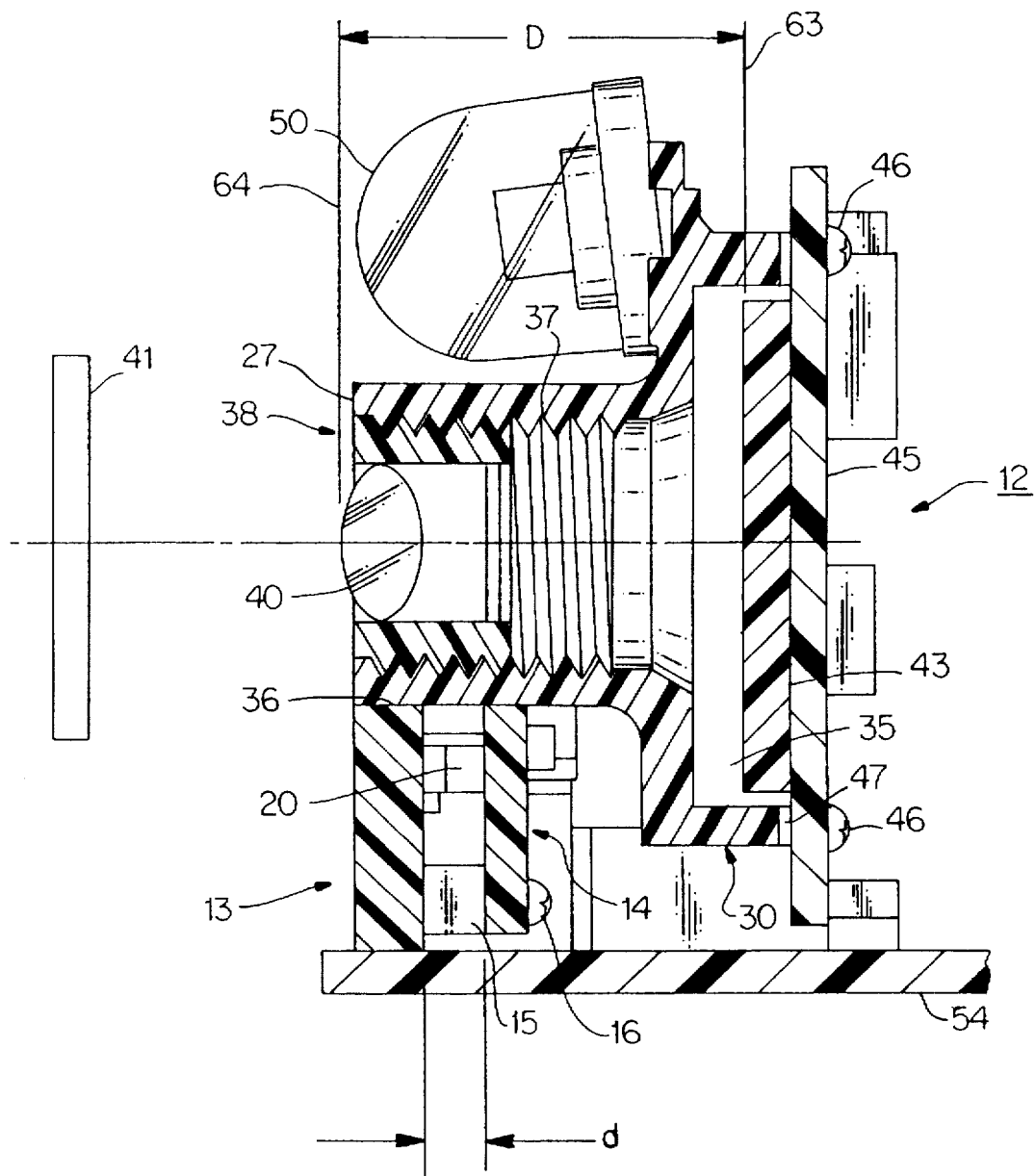
FIG. 3 is an enlarged side elevation in section of the present optical unit with some of the electrical components removed for clarity showing in greater detail the structural and optical element of the unit.

Referring initially to FIGS. 1-3, there is shown a hand-held bar code reader generally referenced 10 that embodies the teachings of the present invention. The reader includes an outer casing 11 shown in phantom outline which contains the component parts of a low profile optical unit generally depicted at 12. These parts include a front light redirecting panel 13 and a LED board 14 that is positioned immediately behind the panel in close parallel alignment therewith. As best seen in FIG. 3, the LED board is mounted upon spacer legs 15 that are integral with the front panel by any suitable type of fasteners such as screws 16 or the like. As will be explained in greater detail below, the spacing (d) between the rear face of the light redirecting panel and the front face of the LED board is minimized to, along with other features of the invention, compact the component parts of the reader into a space saving unit well suited for use in a hand-held reader.

The term "front" used herein in reference to various components contained within the optical unit refers to that side of a part or component of the unit that faces a bar code target as it is being read. Correspondingly, the terms "back" or "rear" as herein used shall refer to that side of a part or component that faces away from the target.

As illustrated in FIG. 2, the light redirecting panel 13 contains a plurality of specially contoured openings 17—17 that are strategically arranged about a central opening 18 provided in the panel. The contoured openings in the panel pass completely through the panel between its front and rear faces. Situated immediately behind each of the contoured opening is a light emitting diode 20 which is mounted on the front face of the LED board.

The light emitting diodes (LEDs) are selected from a family of low profile flat top commercially available devices that are manufactured by a number of suppliers, such as Siemens and Hewlett Packard. The flat top diodes are surface mounted devices equipped with flat epoxy light exit windows rather than lenses. Accordingly, the LEDs mounted on the LED board immediately behind the contoured openings in the light redirecting panel utilize a minimum amount of space and permits the board and the panel to be brought into close parallel alignment in assembly. Although flat top light emitting diodes are used in this embodiment of the invention, other low profile light emitting diodes such as those known as chips on a board can be used without departing from the teachings of the present invention.

Figure 4:
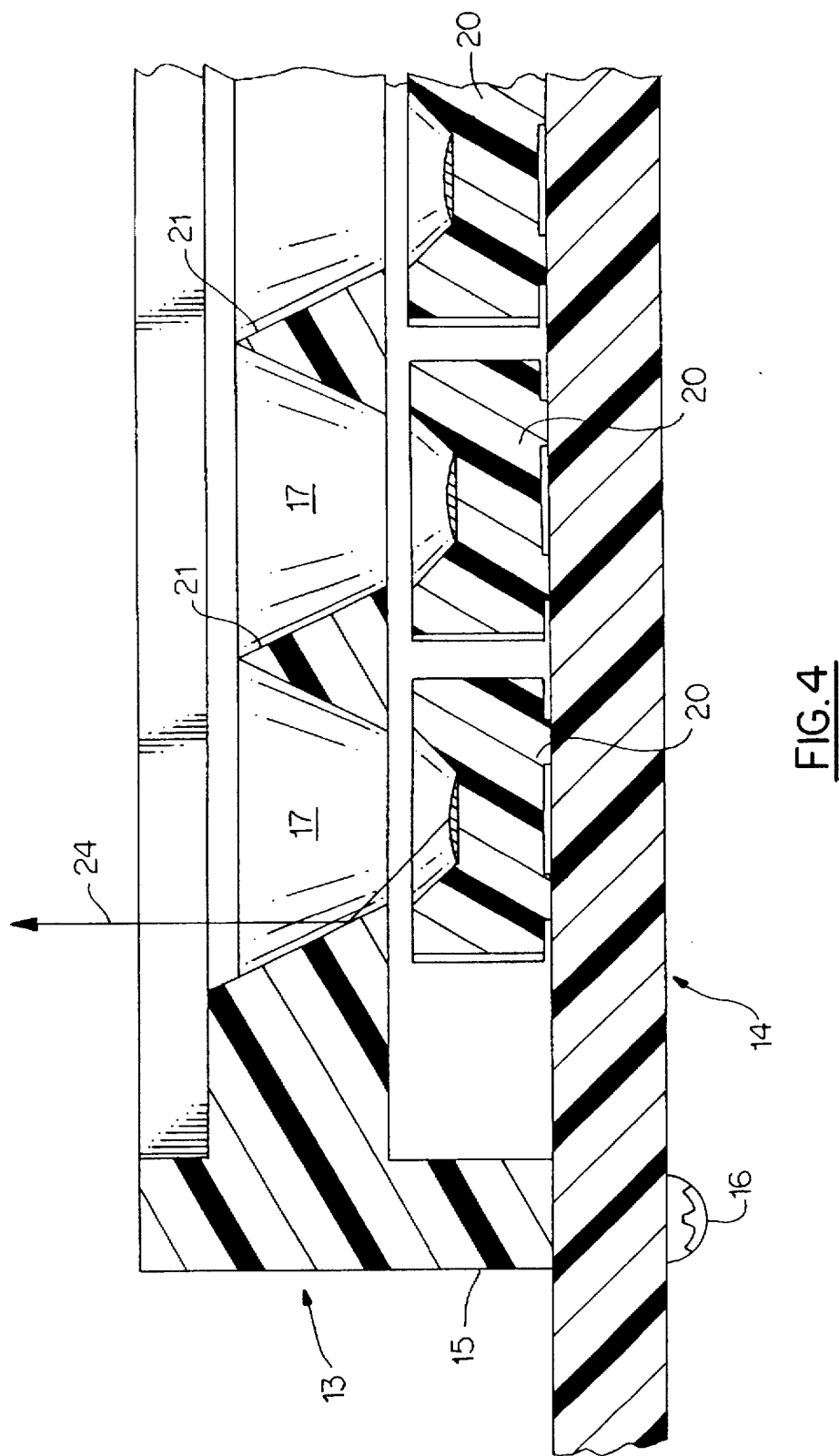
FIG. 4 is a partial enlarged view in section further showing the light distribution panel and the LED board mounted thereto.

FIG. 4 shows in greater detail the positioning of the light emitting diodes with respect to the light redirecting panel. Each contoured opening has a conical shape that diverges from the back side of the panel toward the front or target side of the panel. The surfaces of the contoured opening are either formed of a highly reflective material or are coated with such a material so that light emitted by the LEDs striking the surfaces 21 will be reflected onto a target 41 (FIG. 3) located in front of the optical unit. The reflecting surfaces are specifically contoured to recover light rays that are about 40° to 60° off axis with regard to the axis of the LEDs and redirect the off axis light rays 24 (FIG. 4) toward the target region. Light redirecting panel 13 is described in greater detail in copending U.S. patent application Ser. No. 08/805,739, filed Feb. 25, 1997, which is hereby expressly incorporated herein by reference.

Figure 6:
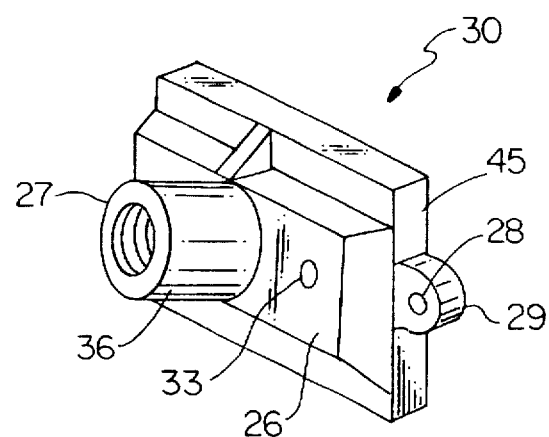
FIG. 6 is a perspective view of the imager housing utilized in the present invention.

Referring more specifically to FIGS. 3 and 6, an imager housing 30 is mounted on the LED board 14. The housing includes a rectangular shaped midsection 26 that is mounted against the back face of the board and held in place by means of screws 32-32 (FIG. 2) that are threaded into holes 33. A cylindrical lens barrel 36 depends upon the mid section of the housing and extends outwardly through axially aligned holes centrally located in the LED board and the light redirecting panel. Preferably, the distal end face 27 of the barrel is located in the plane described by the front face of light redirecting panel, however, it can protrude slightly beyond the front face of the panel.

The rear section 30 of the housing, which also depends from the midsection, is expanded and contains a recessed chamber 35 that opens through the back wall of the housing. A solid state imager 43 is attached to the front face of an imager board 45. The imager board is secured to the back of the imager housing by means of screws 46—46, which are passed through holes 28 formed in tabs 29 projecting to either side of the imager housing (FIG. 6). A light and dust-tight seal 47 is positioned between the front face of the imager board and the back face of the imager housing which prevents ambient light and dust from passing through the back of the housing into the recessed chamber.

The term solid state imager, as herein used, refers to any solid state recording device containing a large number of light sensitive pixels that are arranged in horizontal rows and vertical columns capable of providing a two-dimensional readout. The imager may, for example, be either a CMOS device or, a CCD device, both of which are well known and widely used in the video recording art.

The interior surface of the lens barrel is provided with a female thread 37 that passes inwardly from the distal end 27 of the barrel substantially along its entire length. A lens holder, generally referenced 38, is threaded into the lens barrel and houses a lens system. The lens system can contain one or more lenses that serve to focus a clear image of the target 41 upon the image recording surface of the imager 43. Fine focusing of the image can be obtained by moving the lens holder axially along the lens barrel by means of the screw threads. The distance (D) from the tip of the front lens 40 in the lens system and the plane of the imager is minimized to further compact the system. Lens systems having extremely short back focal length in a range of between 0.3 and 13 mm are now available that can be used in the present system without sacrificing image quality.

In the present embodiment of the invention the flat top LEDs 20 are shown contained within the region defined by the plane 63 in which the imager lies and a parallel plane 64 in which the distal tip of the front lens of the lens system lies. This, coupled with the use of a lens system having a short back focal length, allows the components of the optical unit to be packaged within a compact space. In the event the length of the LEDs exceed the distance (D) between the two parallel planes 63 and 64, the unit may be configured so that the distal tip of the front lens is coaligned so as to make the most effective use of the available space.

An aiming or spotting light 50 is mounted in the top section of the optical unit as illustrated in FIGS. 1-3. The aiming light is an LED which is larger than the light emitting diodes 20—20 and extends back over the light redirecting panel and the LED board and is positioned in a recessed seat formed therein. The aiming light is tilted at a slight angle with regard to the axis of the lens system so that it will direct a beam of light upon a target within the viewing range of the optic. The aiming, which is performed by the operator, is used to align the reader's optic with a target prior to turning on the target illuminating light emitting diodes 20—20. The distal tip of the aiming light, like those of the LEDs, is positioned at or slightly behind the plane 64 so that the entire aiming light lies within the region between the two planes 63 and 64 to again minimize the amount of space occupied by the optical unit. Although not shown, two or more aiming lights may be used to facilitate the operator in the alignment operation. In yet another implementation, the aiming light is one or more laser diodes.

As best illustrated in FIG. 1, the back side of the LED board contains circuitry 52 which, among other things powers and controls the operation of the light emitting diodes. In addition, the back side of the imager board also contains circuitry 53 for generating image data signals of a target recorded from the solid state imager which can be used in decoding the target information. A mother board 54 is connected to the imager board by means of a series of pin connectors 57. (FIG. 1). The mother board 54, contains further circuitry 55 for storing the image data signals and decoding the signal information.

Figure 5:
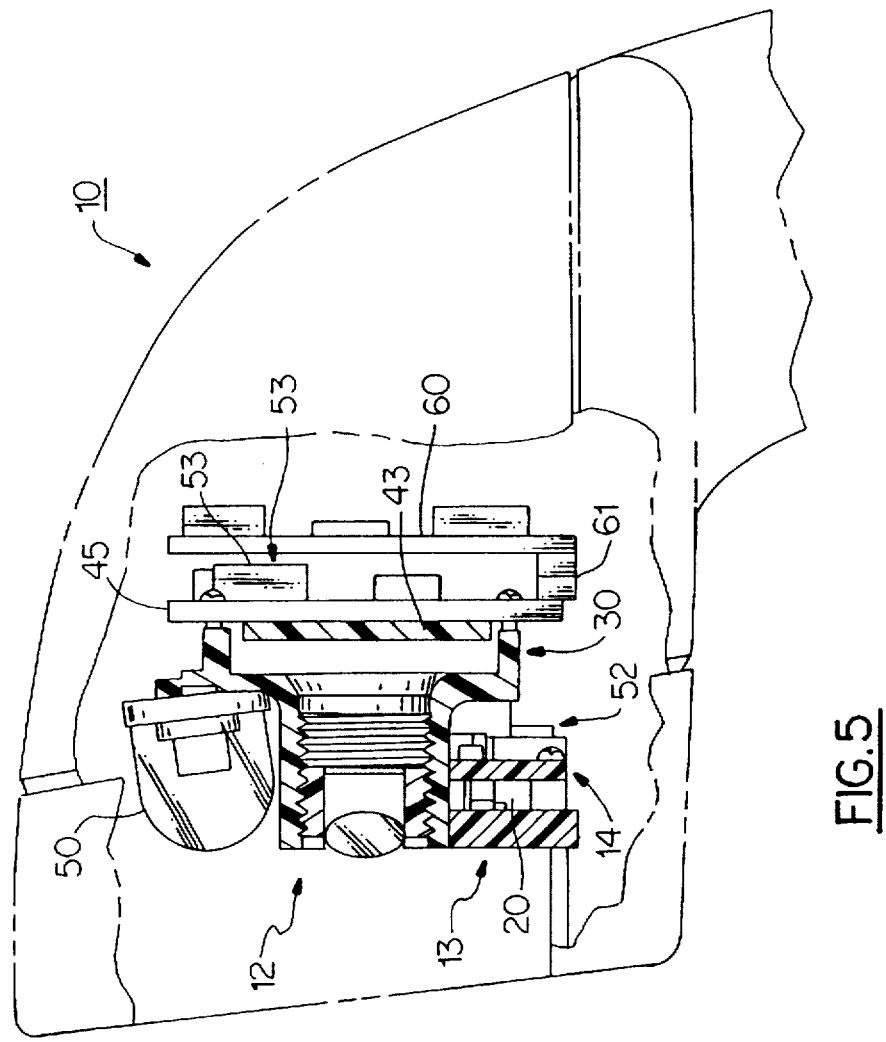
FIG. 5 is a side elevation in section similar to that of FIG. 3 illustrating a further embodiment of the present invention.

A further embodiment of the invention is shown in FIG. 5. In this embodiment, the horizontal mother board, as illustrated in FIG. 1, is replaced with at least one vertically disposed mother board 60 that is mounted in parallel alignment behind the imager board 45 by means of pin connectors 61. Here again, signal storing and decoding circuitry is mounted on one or both sides of the mother board. Alternatively, although not shown, additional mother boards may be similarly mounted in vertical alignment behind the board 60 to provide additional circuitry for servicing the low profile optical unit.

Figure 7:
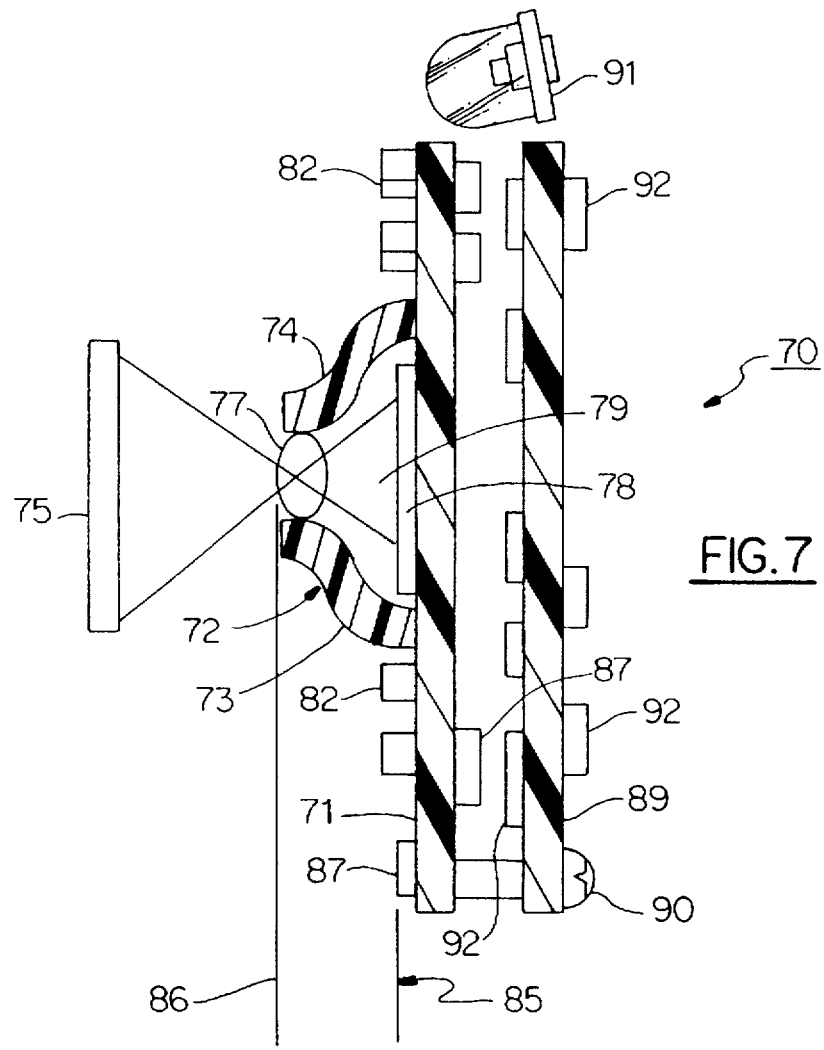
FIG. 7 is a side elevation in section showing a further embodiment of the invention.

Turning now to FIG. 7, there is shown a further embodiment of the present invention. The optical unit, generally referenced 70, includes a LED board 71 on which is mounted an imager housing 72. The imager housing has a rectangular shaped rear section 73 that is centrally located on the LED board. The front section 74 of the housing extends outwardly from the front of the board toward the target 75. The front section of the housing tapers inwardly and terminates in a truncated cylinder in which is mounted a lens system 77. The lens system contains one or more lenses for focusing a target image upon a 2D imager 78 mounted in a recessed chamber 79 formed in the rear section of the housing. The lens system has a short back focal length so that the distance between the front lens of the lens system and the plane of the imager is minimized.

A series of light emitting diodes 82—82 are mounted upon the front face of the LED board. The diodes are arranged about the lens system to effectively illuminate a target within the, viewing range of the optics. It should be understood by one skilled in the art that LEDs may be used in this embodiment that are equipped with an integrated lens. Here again, the diodes are mounted within the region defined by the plane of the imager 85 and a parallel plane 86 in which the tip of the front lens in the lens system lies. Electrical components 87—87 are also mounted on either side of the LED board for, among other things, powering and controlling the LEDs and generating image data signals. A mother board 89 is attached by screws 90 or the like behind the LED board and has electrical circuitry 92—92 thereon for processing image data signals from the LED board. An aiming light 91 is mounted above the boards and is set to deliver an aiming spot into the target region. The distal tip of the aiming lamp is located on or behind plane 86 to again minimize the utilization of space.

While this invention has been explained with reference to the structure disclosed herein, it is not confined to the details set forth and this invention is intended to cover any modifications and changes as may come within the scope of the following claims:

What is claimed is:

1. A low profile optical unit for use in an optical reader which has illumination and optical axes that are generally parallel to one another, and which is adapted to illuminate and read target indicia that are disposed in target regions that are oriented roughly perpendicular to said axes including, in combination:

a plurality of low profile LEDs for emitting light;

a light redirecting panel having a front face and a back face and having a plurality of contoured openings passing therethrough, said contoured openings having light reflecting surfaces for receiving light emitted by respective LEDs and directing said light toward said target region;

an LED board mounted in parallel alignment with said panel behind the back face of said panel for supporting said LEDs in proximity to respective ones of said openings;

an imager housing including a recessed chamber that opens through the back of said housing and a hollow lens barrel extending forward of said recessed chamber through coaxially aligned holes in said panel and said LED board;

an imager board mounted in parallel alignment with said panel and said LED Board and having a solid state two dimensional (2D) imager mounted on the front face thereof, said imager board being secured to said housing with said 2D imager positioned in said recessed chamber; and a lens assembly disposed in said lens barrel for focusing an illuminated image of said target region upon said 2D imager;

wherein said light redirecting panel, said LED board, and said imager board are all oriented generally perpendicular to said axes, and are located in such proximity to one another that the dimensions of said optical unit in directions parallel to said axes are small in relation to the dimensions of said unit in directions perpendicular to said axes.

2. The low profile optical unit of claim 1 wherein each of said openings is so shaped that light directed thereby impinges in an overlapping manner onto said target region as a whole.

3. The low profile optical unit of claim 1 wherein the distance between the back face of said panel and the front face of said LED board is approximately equal to the height of said LEDs.

4. The low profile optical unit of claim 1 further including sealing means for forming a light seal between the front face of the imager board and the back of said housing.

5. The low profile optical unit of claim 1 further including at least one aiming light mounted in a recess formed in the light redirecting panel adjacent to the lens assembly for providing an aiming beam without increasing the length of said unit in a direction parallel to said axes.

6. The low profile optical unit of claim 1 further including at least one aiming light, in which said light redirecting panel and said LED board define a recessed seat which allows said aiming light to be included within said optical unit without increasing the length of said unit in a direction parallel to said axes.

7. The low profile optical unit of claim 1 which the distal end of the most distal one of said barrel and said lens assembly is approximately coplanar with the front face of the light redirecting panel.

8. The low profile optical unit of claim 1 further including a mother board having circuitry for storing and decoding image data produced by said 2D imager, in which said low profile optical unit is adapted to be mounted on and perpendicular to the front portion of said mother board, and in which said 2D imager is electrically connected to said storing and decoding circuitry.

9. A low profile optical unit for use in a 2D bar code reader which has illumination and optical axes that are generally parallel to one another, and which is adapted to illuminate and read a 2D bar code that is located in generally planar target region that is oriented roughly perpendicular to said axes including, in combination:

- a LED board having a plurality of LEDs mounted on said board for emitting light toward a target region situated in front of said board;
- an imager housing secured to the LED board, said housing containing a recessed chamber and a hollow lens barrel extending forward of said recessed chamber toward said target region;
- an imager board secured to the back of said imager housing in substantial parallel alignment with said LED board, said imager board having a solid state imager mounted on the front face thereof within said recessed chamber of said imager housing, wherein the entirety of said imager housing extends forward of said imager board; and
- a lens system mounted in said barrel having at least one lens element for focusing an image of said target region upon said imager;
- wherein said LED board and said imager board are oriented generally perpendicular to said axes, and are located in such proximity to one another that the dimensions of said optical unit in directions parallel to said axes are small in relation to the dimensions of said unit in directions perpendicular to said axes.

10. The low profile optical unit of claim 9 in which said LED board and said imager board are coplanar.

11. The low profile optical unit of claim 9 in which the distal end of the most distal one of said barrel and said lens assembly is approximately coplanar with the distal ends of said LEDs.

12. The low profile optical unit of claim 9 in which the distal ends of the LEDs are mounted in a region bounded by a first plane in which the image recording face of the imager lies, and a second parallel plane in which the distal end of the most distal one of said barrel and said lens assembly lies.

13. The low profile optical unit of claim 9 further including at least one aiming light mounted in a recess in said optical unit adjacent to the lens assembly for providing an aiming beam.

14. The low profile optical unit of claim 9 further including at least one aiming light, in which said LED board defines a recessed seat which allows said aiming light to be included within said optical unit without increasing the length of said unit in directions parallel to said axes.

15. The low profile optical unit of claim 9 further including a mother board having circuitry for storing and decoding image data produced by said imager, in which said low profile optical unit is adapted to be mounted on and perpendicular to the front portion of said mother board, and in which said imager is electrically connected to said storing and decoding circuitry.

16. The low profile optical unit of claim 9 wherein said imager housing is a one-piece unit.

17. The low profile optical unit of claim 9 further including a light seal disposed between said imager board and said housing.

* * * * *